(12) United States Patent
Park

(10) Patent No.: US 9,489,091 B2
(45) Date of Patent: Nov. 8, 2016

(54) ORGANIC LIGHT-EMITTING DISPLAY PANEL

(71) Applicant: Samsung Display Co., Ltd., Yongin (KR)

(72) Inventor: Dae-Kil Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 451 days.

(21) Appl. No.: 14/016,851

(22) Filed: Sep. 3, 2013

(65) Prior Publication Data

US 2014/0340348 A1   Nov. 20, 2014

(30) Foreign Application Priority Data

May 16, 2013   (KR) ......................... 10-2013-0056041

(51) Int. Cl.
*G09G 3/3233* (2016.01)
*G06F 3/044* (2006.01)
*H03K 17/96* (2006.01)
*G09G 3/32* (2016.01)

(52) U.S. Cl.
CPC ............. *G06F 3/044* (2013.01); *G09G 3/3233* (2013.01); *H03K 17/962* (2013.01); *G09G 2300/0426* (2013.01); *G09G 2300/0842* (2013.01); *H03K 2217/960795* (2013.01)

(58) Field of Classification Search
CPC ... G06F 3/044; H03K 17/962; G09G 3/3208
See application file for complete search history.

(56) References Cited

U.S. PATENT DOCUMENTS

| 2007/0216637 | A1* | 9/2007 | Ito ......................... G06F 3/0412 345/102 |
| 2009/0122026 | A1 | 5/2009 | Oh |
| 2009/0219259 | A1* | 9/2009 | Kwon ..................... G06F 3/041 345/173 |
| 2010/0049046 | A1* | 2/2010 | Peiffer ..................... A61B 8/13 600/443 |
| 2010/0219059 | A1* | 9/2010 | Jung ..................... G06F 3/0238 200/5 A |
| 2011/0186414 | A1 | 8/2011 | Kim et al. |
| 2012/0287693 | A1* | 11/2012 | Furutani ................ G11C 14/00 365/49.17 |

FOREIGN PATENT DOCUMENTS

| JP | 2009-123193 | 6/2009 |
| KR | 10-2010-0101852 | 9/2010 |
| KR | 10-2011-0090656 | 8/2011 |
| KR | 10-2012-0083633 | 7/2012 |

* cited by examiner

*Primary Examiner* — Shaheda Abdin
(74) *Attorney, Agent, or Firm* — H.C. Park & Associates, PLC

(57) ABSTRACT

An organic light-emitting display panel includes a display area including pixels configured to display content, and a touch key area including at least one touch key configured to facilitate detection of a touch interaction.

16 Claims, 6 Drawing Sheets

ORGANIC LIGHT-EMITTING DISPLAY PANEL

CROSS-REFERENCE TO RELATED APPLICATION

This application claims priority from and the benefit of Korean Patent Application No. 10-2013-0056041, filed on May 16, 2013, which is incorporated by reference for all purposes as if set forth herein.

BACKGROUND

1. Field

Exemplary embodiments relate to display technology, and, more particularly, to organic light-emitting display panels.

2. Discussion

The evolution in user interface technology has come with a switch from conventional physical user interface components (e.g., "hard" buttons, keys, switches, etc.) to virtual user interface components (e.g., "soft" buttons, keys, switches, etc.). In the mobile terminal (e.g., mobile phone, notebook computer, tablet, etc.) marketplace, these virtual user interface components may be realized in the form of, for example, touch-based input interfaces. One or more touch sensors are typically utilized in association with, for example, these "touch" components to detect whether a touch is input to (or on) a position of a touch screen panel or window corresponding to the touch component. In this manner, a touch component, such as a touch key, may be configured to perform a function conventionally provided by a physical button.

The above information disclosed in this Background section is only for enhancement of understanding of the background of the invention, and, therefore, it may contain information that does not form the prior art that is already known in this country to a person of ordinary skill in the art.

SUMMARY

Exemplary embodiments provide organic light-emitting display panels.

Additional aspects will be set forth in the detailed description which follows and, in part, will be apparent from the disclosure, or may be learned by practice of the invention.

According to exemplary embodiments, an organic light-emitting display panel includes: a display area including pixels configured to display content; and a touch key area including at least one touch key configured to facilitate detection of a touch interaction.

According to exemplary embodiments, an organic light-emitting display panel includes: a substrate including a display area and a touch key area; pixels disposed in the display area; and at least one touch key disposed in the touch key area, the at least one touch key being configured to detect a touch interaction.

According to exemplary embodiments, the complexity, use of additional parts, increased manufacturing time, and related expenses associated with conventional, separately-formed display panels configured to facilitate implementation of one or more touch components may be decreased. In this manner, a device incorporating an exemplary organic light-emitting display panel may be more compact and sleek than traditional devices with separately-formed display panels configured to facilitate implementation of one or more touch components.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
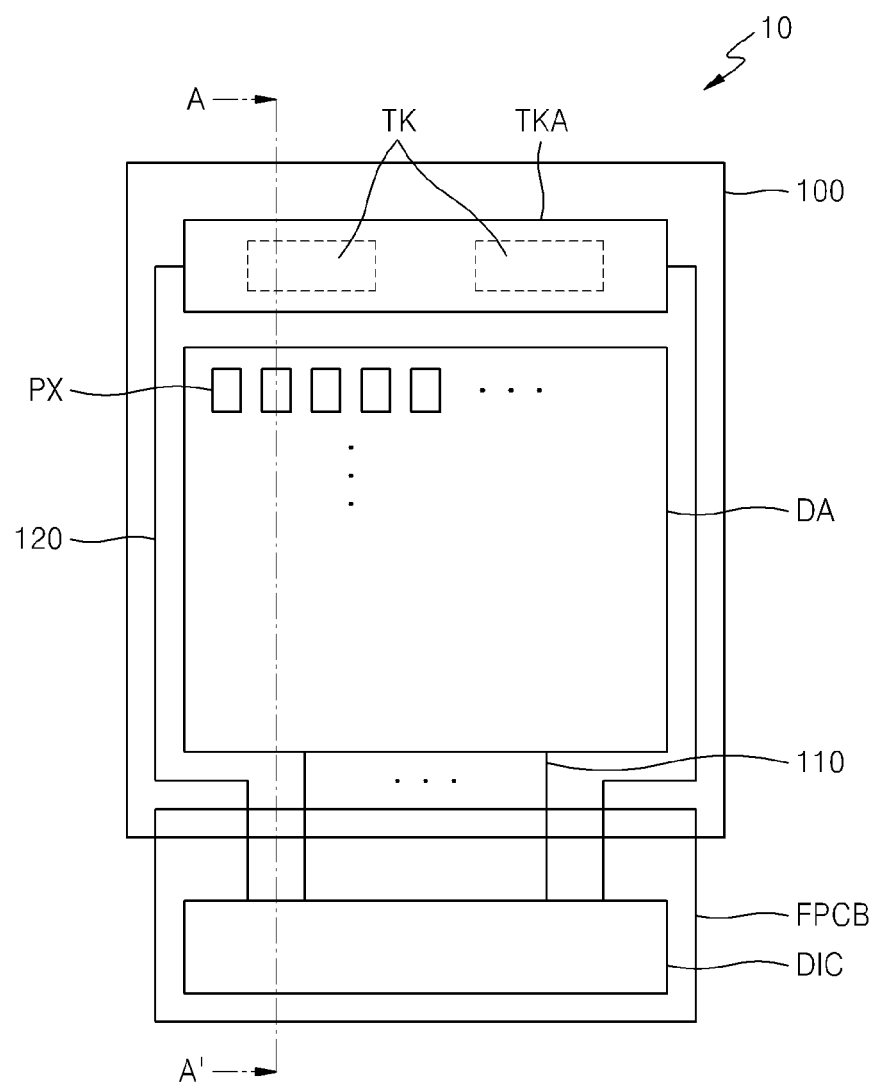
FIG. 1 is a plan view of an organic light-emitting display panel, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
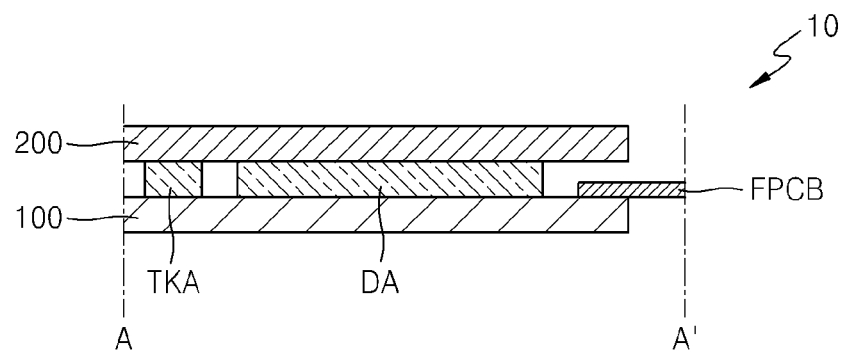
FIG. 2 is a cross-sectional view of the organic light-emitting display panel of FIG. 1 taken along sectional line A-A', according to exemplary embodiments.

FIG. 1 is a plan view of an organic light-emitting display panel 10, according to exemplary embodiments. FIG. 2 is a cross-sectional view of the organic light-emitting display panel 10 taken along sectional line A-A'.

Referring to FIGS. 1 and 2, the organic light-emitting display panel 10 (hereinafter "display panel 10") includes a first substrate 100 and a second substrate 200 that is coupled (e.g., bonded) to the first substrate 100 via any suitable mechanism, e.g., one or more adhesives, chemical reactions, sealants, etc.

The first substrate 100 may be a flexible substrate and may be formed of a plastic material including, for example, polyimide (PI), polyethylene terephthalate (PET), polycarbonate (PC), polyethylene naphthalate (PEN), polyarylate (PAR), polyetherimide (PEI), and/or the like. It is also contemplated that one or more fluropolymers (FEP), copolymers, and/or the like may be utilized. To this end, the material(s) may be selected in consideration of one or more electrical, mechanical, chemical, and thermal properties, e.g., to balance heat-resistance and durability of the first substrate 100. Additionally (or alternatively), the first substrate 100 may be formed utilizing various materials, such as, for instance, metal, glass, etc.

The second substrate 200 may be an encapsulation substrate that is disposed on the first substrate 100. In this manner, the second substrate 200 may be configured to block (or otherwise protect) a thin film transistor (TFT) and an organic light-emitting diode (OLED), which are disposed (or otherwise arranged) on the first substrate 100, from one or more external forces (e.g., moisture, air, etc.) and/or contaminants (e.g., dust, debris, etc.). The second substrate 200 may be a flexible substrate, which may be similar to the first substrate 100. To this end, the second substrate 200 may be formed using one or more of the various materials previously mentioned, such as, for instance, one or more plastic, metal, glass, etc., materials. It is also contemplated that the second substrate 200 may be a thin film encapsulate (TFE) substrate having a structure in which inorganic layers and organic layers are alternately stacked. As such, the second substrate 200 may be formed as a single or multilayer structure.

According to exemplary embodiments, the second substrate 200 is disposed on and faces the first substrate 100. To this end, the second substrate 200 is coupled (e.g., bonded) to the first substrate 100 using a sealing member (not shown) that is arranged along a side edge of the second substrate 200.

The first substrate 100 may be formed with one or more TFTs, OLEDs, and capacitors. As described herein, an array including one or more TFTs, one or more OLEDs, and one or more capacitors may be referred to as a "TFT array."

As seen in FIG. 1, the first substrate 100 includes a display area DA and a touch key area TKA. The display area DA is configured to facilitate the display of content, such as various images, based on light emitted from one or more pixels PX of the display area DA. The touch key area TKA may be an outer region of the display area DA. For instance, the touch key area TKA may be disposed adjacent to the display area DA.

The display area DA includes a plurality of pixels PX. The pixels PX may be repeatedly disposed in column and row directions, such as in a matrix formation. It is contemplated, however, that any other suitable arrangement may be utilized. Each of the pixels PX may include a pixel circuit including a plurality of TFTs, a capacitor, and an OLED configured to emit light in response to receiving a driving current from the pixel circuit.

The touch key area TKA includes at least one touch-based interactive element (e.g., touch key) TK. The touch key area TKA may further include an emission unit (not shown) configured to emit light when a touch is detected in association with the touch key TK. The touch key area TKA may be formed in a region other than the display area DA of the first substrate 100. As seen in FIG. 1, the touch key area TKA is formed at an upper region of the first substrate 100 disposed outside of and adjacent to the display area; however, it is contemplated that the touch key area TKA may be disposed in any suitable location.

According to exemplary embodiments, the display panel 10 includes a film formed with a driving circuit configured to supply a driving signal to the pixels PX connected to a side edge of the first substrate 100. The film including the driving circuit may be a flexible printed circuit board (FPCB). Referring to FIG. 1, the FPCB is connected to a side edge of the first substrate 100 that is opposite to the side where the touch key area TKA is disposed. In this manner, the display area DA is disposed between the FPCB and the touch key area TKA. It is contemplated, however, that the FPCB may be alternatively disposed in any suitable position.

The FPCB is connected to a pad unit (not shown) having a pad electrically connected to a first driving line 110 of the display area DA and a second driving line 120 of the touch key area TKA. The FPCB includes a driving integrated circuit DIC configured to control operation of the display area DA and the touch key area TKA. Accordingly, by using one FPCB, it is possible to supply a control signal to control the driving of the display area DA via the first driving line 110, to supply a control signal to control the driving of the touch key area TKA via the second driving line 120, and to receive a touch detection signal from, for example, the touch key area TKA. As such, a dual purpose FPCB may be utilized, which eliminates a need to drive the touch key area TKA with a separate FPCB, and, in this manner, an associated manufacturing process may be simplified and corresponding costs may be reduced. The driving integrated circuit DIC may include a scan driving circuit (not shown) and a data driving circuit (not illustrated). The scan driving circuit is configured to supply a scan signal to a scan line of each pixel PX. The data driving circuit is configured to supply a data signal to a data line of each pixel PX. Also, the driving integrated circuit DIC may include a touch driving circuit to control (or otherwise facilitate) touch detection by the touch key TK and to control emission of the emission unit. The touch driving circuit is configured to supply a control signal to control the emission unit to emit light when a touch is detected in association with the touch key TK.

As seen in FIG. 1, each of the first driving line 110 and the second driving line 120 is formed as one line; however, it is contemplated that each of the first driving line 110 and the second driving line 120 may be formed as a plurality of lines. For example, the first driving line 110 may include any suitable number of lines to supply a scan signal S, a data signal D, a first power voltage ELVDD, and a second power voltage ELVSS to the various pixels PX of the display area DA. The second driving line 120 may include any suitable number of lines to supply a touch scan signal TS, a touch data signal TD, a first power voltage ELVDD, a second power voltage ELVSS, a touch transmission signal Tx, and a touch reception signal Rx to the various touch keys TK of the touch key area TKA.

Figure 3:
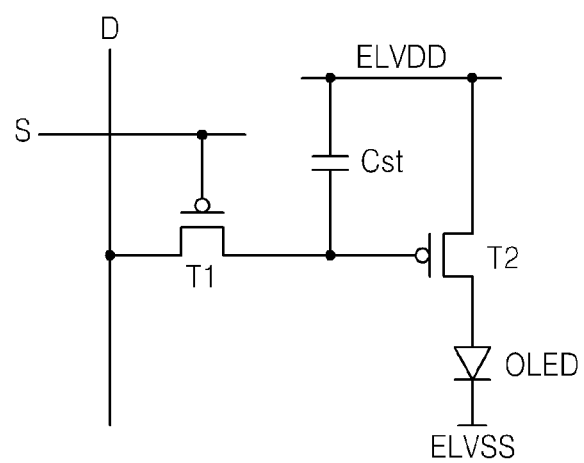
FIG. 3 is a circuit diagram of a pixel of the organic light-emitting display panel of FIG. 1, according to exemplary embodiments.

FIG. 3 is a circuit diagram of a pixel PX of the organic light-emitting display panel of FIG. 1, according to exemplary embodiments.

Referring to FIG. 3, the pixel PX of the display area DA includes a first TFT T1, a second TFT T2, and a capacitor Cst. It is contemplated, however, that the pixel PX may be configured in any other suitable manner. For instance, the pixel PX may include any suitable number of TFTs, any suitable number of capacitors, and any suitable number of OLEDs. To this end, the structure of the pixel PX may include a different wiring scheme in which separate wirings are further formed, existing wires are not used, etc.

As seen in FIG. 3, the first TFT T1 includes a gate electrode connected to a scan line configured to transmit the scan signal S, a first electrode connected to a data line configured to transmit the data signal D, and a second electrode connected to a first electrode of the capacitor Cst and a gate electrode of the second TFT T2. The second TFT T2 includes a gate electrode connected to the gate electrode of the first TFT T1 and the first electrode of the capacitor Cst, a first electrode connected to a line configured to supply the first power voltage ELVDD, and a second electrode connected to an anode electrode of an OLED. The capacitor Cst includes the first electrode connected to the first electrode of the first TFT T1 and the gate electrode of the second TFT T2, and a second electrode connected to the line configured to supply the first power voltage ELVDD. The OLED has a structure in which the anode electrode is connected to the second electrode of the second TFT T2, and a cathode electrode is connected to a line that supplies a second power voltage ELVSS.

According to exemplary embodiments, when a scan signal S is supplied by the scan line to "turn on" the first TFT T1, the first TFT T1 is able to transfer a data signal D, which is supplied from the data line, to the first electrode of the capacitor Cst. In this manner, the capacitor Cst may be charged by a voltage corresponding to the data signal D. A driving current corresponding to the voltage charged in the capacitor Cst may be delivered to the OLED via the second TFT T2 to enable the OLED to emit light.

Figure 4:
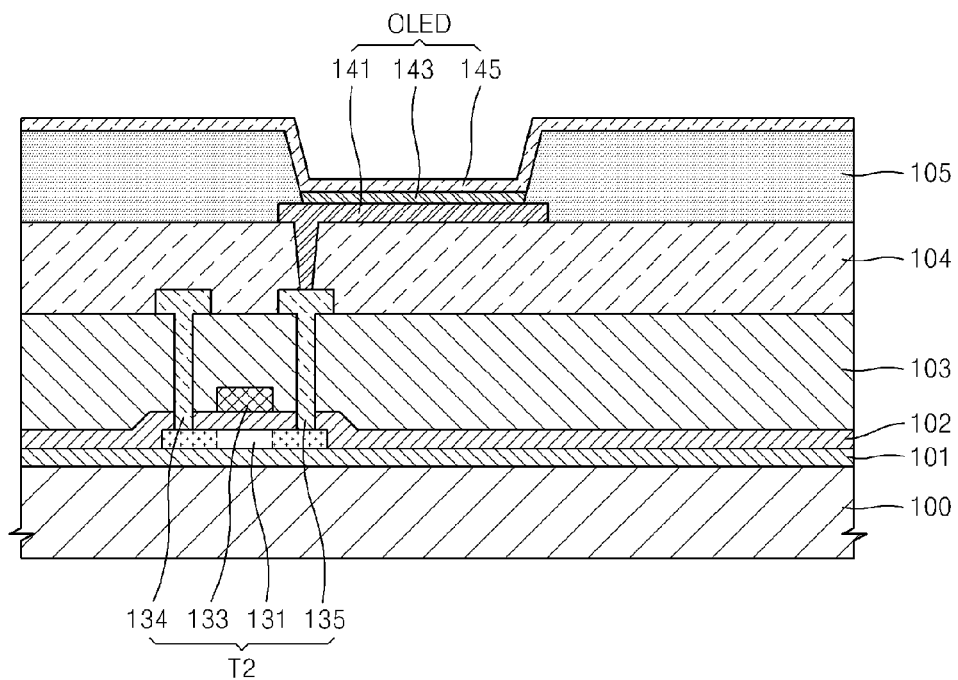
FIG. 4 is a cross-sectional view of the pixel of FIG. 3, according to exemplary embodiments.

FIG. 4 is a cross-sectional view of the pixel of FIG. 3, according to exemplary embodiments. It is noted that FIG. 4 illustrates the respective cross-sections of the second TFT T2 and the OLED. It is noted that the cross-section of the first TFT T1 may be substantially similar to the second TFT T2, and, therefore, to avoid obscuring exemplary embodiments described herein, a duplicative description is not provided.

Referring to FIG. 4, a buffer layer 101 is formed on the first substrate 100, and a pixel circuit including the second TFT T2 is formed on the buffer layer 101. The first substrate 100 may be formed from a plastic material having flexibility, or a flexible substrate formed of a metal foil, such as stainless steel (SUS), and/or the like. It is contemplated, however, that the first substrate 100 may be formed of any suitable material, such as, for example, a transparent glass material containing silicon oxide ($SiO_x$) as a main component.

The buffer layer 101 may function to prevent penetration of foreign substances, and may also serve to planarize a surface of the first substrate 100. The buffer layer 101 may be formed of various materials capable of performing the aforementioned functions. For example, the buffer layer 101 may be formed of an inorganic material including $SiO_x$, silicon nitride (Si$_x$N$_y$), silicon oxynitride (SiO$_x$N$_y$), aluminium oxide (Al$_x$O$_y$), aluminium nitride (AlN), titanium oxide (Ti$_x$O$_y$), titanium nitride (TiN), and/or the like, and/or an organic material including PI, polyester, acryl, and/or the like. It is also contemplated that the buffer layer 101 may be formed as a multilayer structure of the inorganic material and/or the organic material. It is noted that the buffer layer 101 may be omitted.

An active layer 131 is formed on the buffer layer 101. The active layer 131 may be formed of an organic semiconductor material or an inorganic semiconductor material including, for instance, amorphous silicon, polysilicon, etc. The active layer 131 includes a source region, a drain region, and a channel region disposed between the source region and the drain region.

A gate insulating layer 102 is formed on the buffer layer 101 and covers the active layer 131. A gate electrode 133 is formed on the gate insulating layer 102 and is disposed in correspondence with the channel region of the active layer 131.

An interlayer insulating layer 103 is formed on the gate insulating layer 102 and covers the gate electrode 133. A source electrode 134 and a drain electrode 135 are formed on the interlayer insulating layer 103 and contact the source region and the drain region of the active layer 131, respectively, via corresponding contact holes (or vias).

Although the second TFT T2 has been described as including the aforementioned structure, it is contemplated that any other suitable structure may be utilized.

As seen in FIG. 4, a passivation layer 104 is formed on the interlayer insulating layer 103 and covers the second TFT T2. The passivation layer 104 may be formed by singularly or multiply stacking insulating layers having a planarized top surface upon one another. The passivation layer 104 may be formed of any suitable material, such as, for instance, an inorganic material and/or an organic material.

An anode electrode 141 of the OLED, which is electrically connected to the second TFT T2, is formed on the passivation layer 104. A pixel-defining layer (PDL) 105 is formed on the passivation layer 104 and covers one or more side edges of the anode electrode 141. The PDL 105 includes an opening of a determined size, which partially exposes the anode electrode 141.

An intermediate layer 143, including an emission layer (EML), is formed on a top surface of the exposed anode electrode 141. A cathode electrode 145 is formed on the intermediate layer 143 and the PDL 105. To this end, it is noted that the cathode electrode 145 may cover the walls of the opening exposing the intermediate layer 143.

Figure 5:
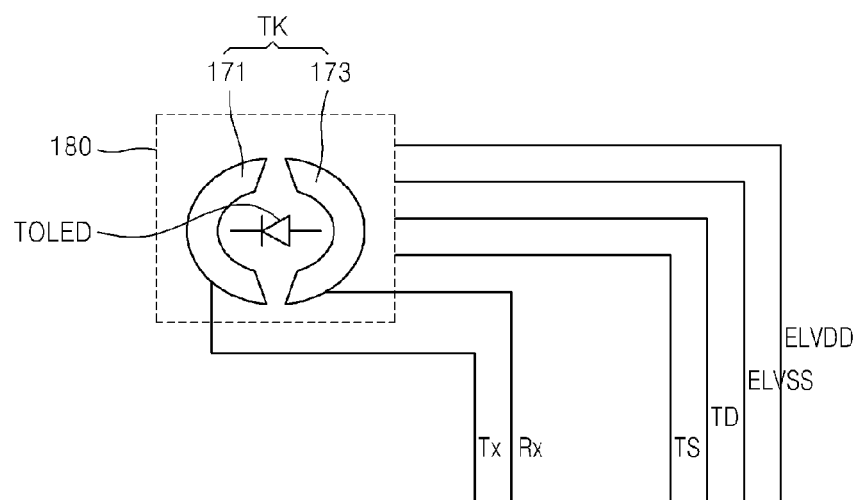
FIG. 5 schematically illustrates a touch key area, according to exemplary embodiments.
Figure 6:
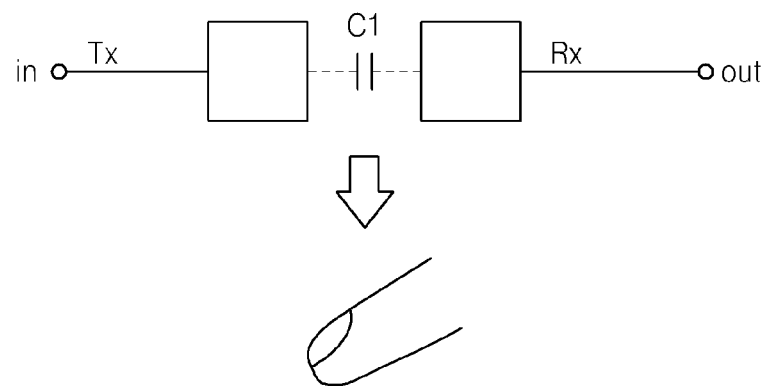
FIG. 6 illustrates touch detection in association with the touch key area of FIG. 5, according to exemplary embodiments.
Figure 7A:
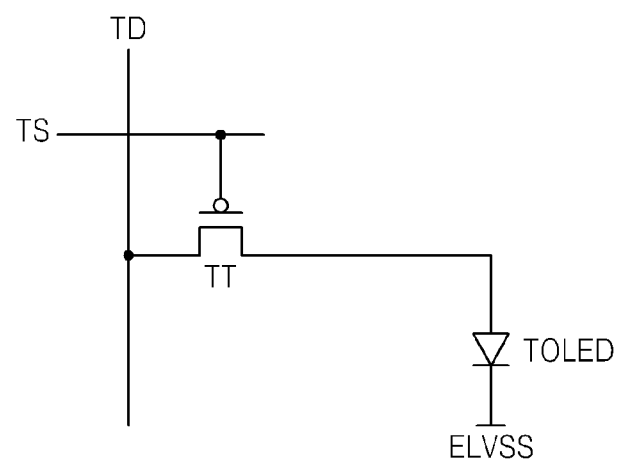
FIGS. 7A and 7B are circuit diagrams of an emission unit of the touch key area of FIG. 5, according to exemplary embodiments.
Figure 7B:
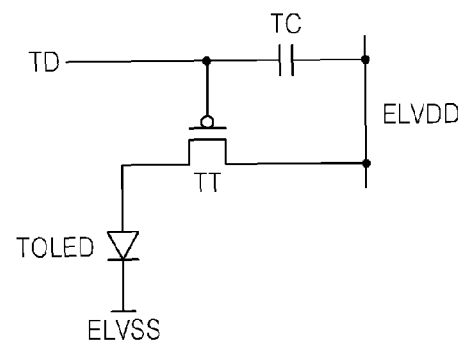

FIG. 5 schematically illustrates the touch key area TKA, according to exemplary embodiments. FIG. 6 illustrates touch detection in association with the touch key area TKA of FIG. 5, according to exemplary embodiments. FIGS. 7A and 7B are circuit diagrams of an emission unit 180 of the touch key area TKA of FIG. 5, according to exemplary embodiments.

Referring to FIG. 5, the touch key TK and the emission unit 180 configured to emit light in response to the touch detection are formed in the touch key area TKA. The touch key TK includes a first (e.g., transmission) electrode 171 and a second (e.g., reception) electrode 173. The touch key TK and the emission unit 180 may be formed as a set, and the set of the touch key TK and the emission unit 180 may be independently driven and may emit light. It is noted that a number, a size, and a position of the set of the touch key TK and the emission unit 180 may vary according to a design and an application of a display apparatus.

As illustrated in FIG. 5, the transmission electrode 171 and the reception electrode 173 of the touch key TK face each other on the same layer and are spaced apart from one another by a determined distance. The electrode patterns of the transmission electrode 171 and the reception electrode 173 have a semi-circular shape; however, it is contemplated that any suitable shape may be utilized, such as, for instance, a rhombic shape, a quadrangular shape, a diamond shape, a line shape, and/or the like. A capacitance may be formed between the transmission electrode 171 and the reception electrode 173.

Referring to FIG. 6, a transmission signal Tx having a constant value may be periodically applied to the transmission electrode 171. In this manner, an electric field may be formed between the transmission electrode 171 and the reception electrode 173, such that a capacitance C1 is formed. A reception signal RX corresponding to the capacitance C1 is output from the reception electrode 173. When a user's finger (or other touch tool) approaches the touch key TK so as to input a touch, capacitance C1 between the transmission electrode 171 and the reception electrode 173 is changed to capacitance C1' due to the conductivity of the human body. To this end, a reception signal RX' corresponding to the changed capacitance C1' is output from the reception electrode 173, which enables the touch to be detected.

According to exemplary embodiments, when the touch is detected, a function that is allocated to the touch key TK may be performed. The function that is allocated to the touch key TK may be based on combination of a total number of touches, a touch duration time, and/or the like. It is noted that the function(s) may be allocated based on the application of an apparatus including the organic light-emitting display panel 10.

Also, when the touch is detected, a touch OLED TOLED of the emission unit 180 may emit light in conjunction with the touch key TK. In this manner, the user may recognize the touch key TK that the user has touched. It is noted that the emission of the light by the touch key TK may be aesthetically pleasing to the user. The emission unit 180 may be formed around the touch key TK or may be disposed between the transmission electrode 171 and the reception electrode 173 of the touch key TK.

As illustrated in FIG. 7A, the emission unit 180 may include a touch TFT TT and the touch OLED TOLED. The touch TFT TT may include a gate electrode connected to a touch scan line, a first electrode connected to a touch data line, and a second electrode connected to an anode electrode of the touch OLED TOLED. The touch OLED TOLED may include the anode electrode connected to the second electrode of the touch TFT TT and a cathode electrode connected to a line that supplies a second power voltage ELVSS.

According to exemplary embodiments, when the touch is detected and a touch scan signal TS is supplied from the touch scan line, the touch TFT TT provides a touch data signal TD, which is supplied from the touch data line, to the anode electrode of the touch OLED TOLED. In this manner, the touch OLED TOLED is configured to emit light in response to a current that corresponds to the voltage difference between the anode electrode and the cathode electrode of the touch OLED TOLED. It is noted that the touch OLED TOLED is configured to emit light of a determined wavelength according to an emission layer forming material. To this end, the brightness of the touch OLED TOLED is based on the touch data signal TD.

The second power voltage ELVSS applied to the cathode electrode of the touch OLED TOLED corresponds to the second power voltage ELVSS applied to the OLED included in each pixel PX of the display area DA. Since power voltages used to drive the display area DA are used by the touch key area TKA, an additional external signal is not necessarily required, but may be utilized if desired.

As illustrated in FIG. 7B, the emission unit 180 may include a touch TFT TT, a touch capacitor TC, and the touch OLED TOLED. The touch TFT TT may include a gate electrode connected to a touch data line, a first electrode connected to a line that supplies a first power voltage ELVDD, and a second electrode connected to an anode electrode of the touch OLED TOLED. The touch capacitor TC may include a first electrode connected to the gate electrode of the touch TFT TT and a second electrode connected to the line that supplies the first power voltage ELVDD. The touch OLED TOLED may include the anode electrode connected to the second electrode of the touch TFT TT and a cathode electrode connected to a line that supplies a second power voltage ELVSS.

According to exemplary embodiments, when a touch is detected, and, as such, a touch data signal TD is supplied from the touch data line to the touch capacitor, the touch capacitor TC is charged by a voltage corresponding to the touch data signal TD. Further, the touch TFT TT is "turned on," which enables the touch OLED TOLED to emit light based on a current corresponding to the voltage charged in the touch capacitor TC. To this end, the touch OLED TOLED is configured to emit light of a determined wavelength based on an emission layer forming material at a brightness according to the touch data signal TD.

The first power voltage ELVDD and the second power voltage ELVSS applied to the respective electrodes of the touch OLED TOLED correspond to the first power voltage ELVDD and the second power voltage ELVSS applied to the OLED included in each pixel PX of the display area DA. That is, since power voltages that are used in driving the display area DA are used in the touch key area, an additional external signal is not necessarily required, but may be utilized as desired.

Although the emission unit 180 has been described as including the aforementioned structure shown in FIGS. 7A and 7B, it is contemplated that any other suitable structure may be utilized. For instance, the emission unit 180 may have the same structure as each pixel PX of the display area DA illustrated in FIG. 3.

Figure 8:
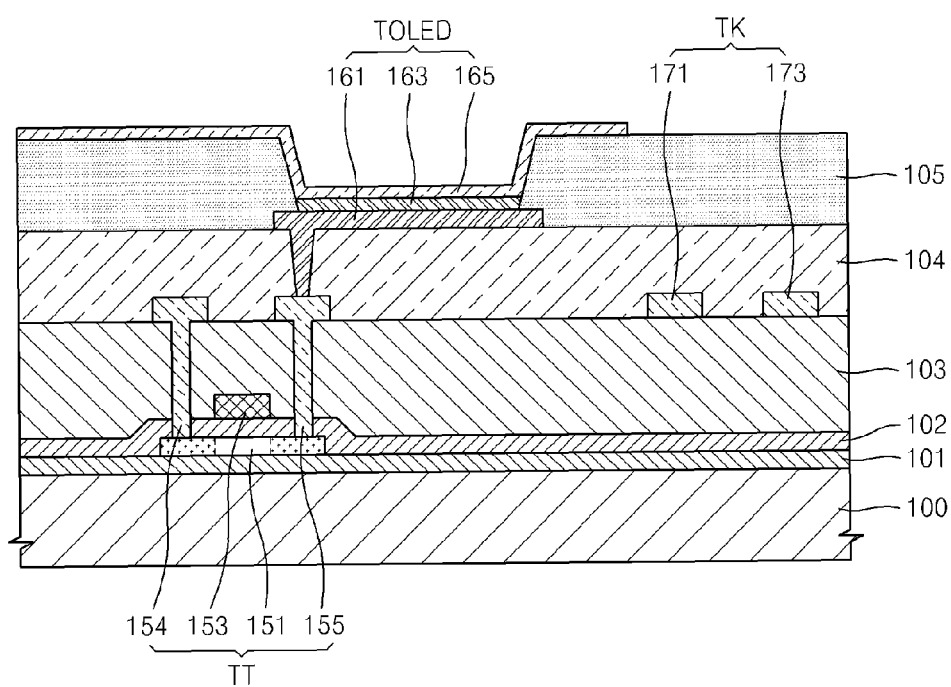
FIG. 8 is a cross-sectional view of a touch key area, according to exemplary embodiments.

FIG. 8 is a cross-sectional view of the touch key area TKA, according to exemplary embodiments. It is noted that the touch capacitor TC is not illustrated in FIG. 8.

Referring to FIG. 8, the buffer layer 101 is formed on the first substrate 100, and the touch TFT TT and the touch capacitor TC are formed on the buffer layer 101. The touch TFT TT and the touch capacitor TC may be formed via a process that is the same as a process of forming a TFT and a capacitor of the pixel circuit of the display area DA.

The first substrate 100 may be formed from a plastic material having flexibility, or a flexible substrate formed of a metal foil, such as SUS, and/or the like. It is contemplated, however, that the first substrate may be formed of any suitable material, such as, for example, a transparent glass material containing $SiO_x$ as a main component.

The buffer layer 101 may function to prevent penetration of foreign substances, and may also serve to planarize a surface of the first substrate 100. The buffer layer 101 may be formed of various materials capable of performing the aforementioned functions. For example, the buffer layer 101 may be formed of an inorganic material including $SiO_x$, $Si_xN_y$, $SiO_xN_y$, $Al_xO_y$, AlN, $Ti_xO_y$, TiN, and/or the like, and/or an organic material including PI, polyester, acryl, and/or the like. It is also contemplated that the buffer layer 101 may be formed as a multilayer structure of the inorganic material and/or the organic material. It is noted that the buffer layer 101 may be omitted.

An active layer 151 is formed on the buffer layer 101. The active layer 151 may be formed of an organic semiconductor material or an inorganic semiconductor material including, for example, amorphous silicon, polysilicon, etc. The active layer 151 includes a source region, a drain region, and a channel region disposed between the source region and the drain region.

A gate insulating layer 102 is formed on the buffer layer 101 and covers the active layer 151. A gate electrode 153 is formed on the gate insulating layer 102 and is disposed in correspondence with the channel region of the active layer 151.

An interlayer insulating layer 103 is formed on the gate insulating layer 102 and covers the gate electrode 153. A source electrode 154 and a drain electrode 155 are formed on the interlayer insulating layer 103 and contact the source region and the drain region of the active layer 151, respectively, via corresponding contact holes (or vias). As seen in FIG. 8, a transmission electrode 171 and a reception electrode 173 of the touch key TK may be formed on the same layer and of the same material as the source electrode 154 and the drain electrode 155.

Although the touch TFT TT has been described as including the aforementioned structure, it is contemplated that any other suitable structure may be utilized.

As seen in FIG. 8, the passivation layer 104 is formed on the interlayer insulating layer 103 and covers the touch TFT TT. The passivation layer 104 may be formed by singularly or multiply stacking insulating layers having a planarized top surface upon one another. The passivation layer 104 may be formed of any suitable material, such as, for example, an inorganic material and/or an organic material.

An anode electrode 161 of the touch OLED TOLED, which is electrically connected to the touch TFT TT, is formed on the passivation layer 104. The PDL 105 is formed on the passivation layer 104 and covers one or more side edges of the anode electrode 161. The PDL 105 includes an opening of a determined size, which partially exposes the anode electrode 161.

An intermediate layer 163, including an EML, is formed on a top surface of the exposed anode electrode 161. A cathode electrode 165 is formed on the intermediate layer 163 and the PDL 105. A portion of the cathode electrode 165, which is formed in a region including the touch key TK, may be removed.

According to exemplary embodiments, the transmission electrode 171 and the reception electrode 173 may be formed from the same material layer as the source electrode 154 and the drain electrode 155. It is contemplated, however, that the transmission electrode 171 and the reception electrode 173 may be formed from the same material layer as the gate electrode 153, the anode electrode 161, and/or the cathode electrode 165. Also, the touch OLED TOLED of FIG. 8 is shown as being disposed around the transmission electrode 171 and the reception electrode 173. It is contemplated, however, that the touch OLED TOLED may be disposed between the transmission electrode 171 and the reception electrode 173.

Figure 9:
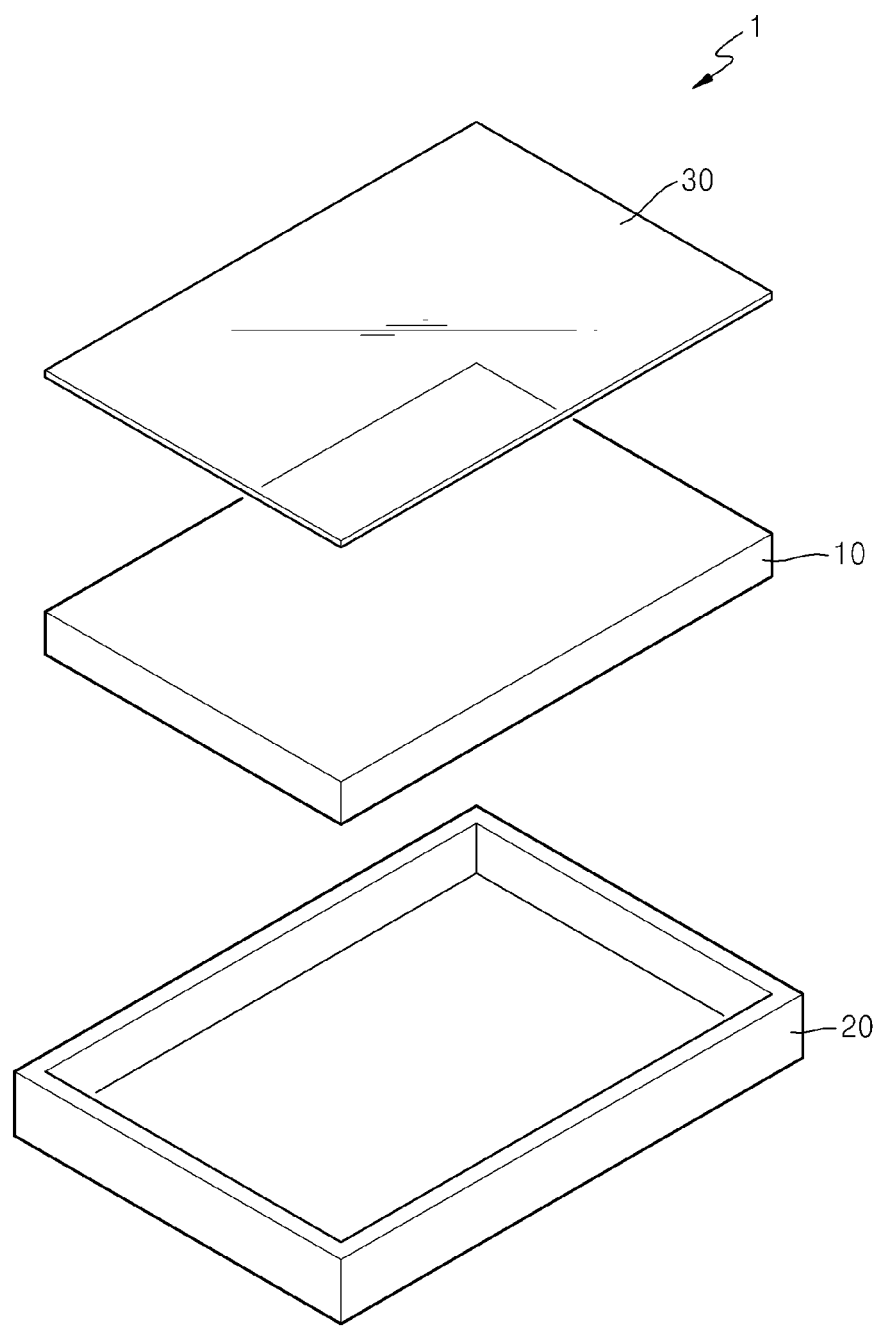
FIG. 9 is an exploded perspective view of an organic light-emitting display apparatus, according to exemplary embodiments.

FIG. 9 is an exploded perspective view of an organic light-emitting display apparatus, according to exemplary embodiments.

Referring to FIG. 9, the organic light-emitting display apparatus 1 may include a housing 20, the display panel 10 housed (or otherwise supported) in the housing 20, and a window 30, which may be combined to a top portion of the display panel 10. In this manner, the housing 20 may be configured to house (or otherwise support) the display panel 10 and the window 30.

The display panel 10 is formed with an OLED, a FPCB, and various electronic parts so as to display content according to a user control. The display panel 10 may further include a touch screen panel that is attached to an exterior surface of the display panel 10. The display panel 10 may be wholly or partially arranged in the housing 20. The display panel 10 may be fixed in the housing 20 using one of any suitable methods.

The touch screen panel may be disposed to correspond to the display area DA of the display panel 10, other than the touch key area TKA of the display panel 10. The touch screen panel is an input device by which a user may input a command to, for example, select instruction content on a screen with the hand, an object, or any other interaction tool. In this manner, the touch screen panel may be arranged on a front face of the display panel 10 and may be configured to convert a contact position that the user directly contacts with the hand, object, or tool into an electrical signal. To this end, instruction content that is selected at the contact position may be recognized as an input signal. The touch screen panel may replace a separate input device, such as a keyboard, a mouse, or the like. The touch screen panel may be embodied as a resistive-type touch screen panel, a beam sensing-type touch screen panel, a capacitive-type touch screen panel, and/or the like. In this manner, when the user's hand, object, or tool contacts the capacitive-type touch screen panel, the capacitive-type touch screen panel senses variation of capacitance formed between a conductive sensing pattern and another adjacent sensing pattern or between the conductive sensing pattern and a ground electrode. As such, the capacitive-type touch screen panel is configured to convert a contact position into an electrical signal.

To improve mechanical strength, the window 30 may be additionally arranged on the top surface of the display panel 10. The window 30 may be configured to prevent damage, such as a scratch, on the display panel 10, as well as configured to prevent penetration of foreign substances and protect the display panel 10 from external shock. Also, when the display panel 10 has flexibility, the window 30 may be formed of a plastic material having suitable heat-resistance and durability, or may be formed of a reinforced transparent glass material. The window 30 may be formed with a symbol or a mark corresponding to the touch key TK of the display panel 10.

It is noted that the aforementioned display apparatus may be alternatively configured in any other suitable manner to include the display panel 10 including the touch key area TKA. For example, a touch sensor may be formed in an area corresponding to the display area DA of the first substrate 100, in the second substrate 200 of the display panel 10, so that an additional touch screen panel is not necessarily required, but may be used if desired. As another example, a touch sensor may be formed in an area of the window 30 corresponding to the display area DA of the first substrate 100, so that an additional touch screen panel may not be necessarily required, but may be used if desired.

According to exemplary embodiments, the touch key TK and the touch OLED TOLED may be formed at a side of the display panel 10 by forming a pixel PX in the display area DA of the display panel 10, and, as such, the touch key TK may be embedded in the display panel 10 without additional manufacturing processes or using additional parts. In this manner, the touch key TK may be embedded as part of the display panel 10, such that conventional increased costs due to the addition of a part may be decreased, utilization of a product design may be improved, and the display apparatus may be more compact.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. An organic light-emitting display panel, comprising:
a display area comprising pixels configured to display content; and
a touch key area disposed outside the display area, the touch key area comprising at least one touch key,
wherein the at least one touch key comprises a first touch electrode and a second touch electrode spaced apart from the first touch electrode, the first touch electrode and the second touch electrode being disposed in the same layer as one another,
wherein each of the pixels comprises:
a thin film transistor (TFT) comprising a gate electrode on a first insulating layer and a source electrode and a drain electrode on a second insulating layer covering the gate electrode; and
an organic light-emitting diode (OLED) comprising a first electrode on a third insulating layer covering the source electrode and the drain electrode and electrically connected to one of the source electrode and the drain electrode, a second electrode, and an emitting layer between the first electrode and the second electrode, and
wherein both of the first touch electrode and the second touch electrode are disposed on one of the first insulating layer, the second insulating layer, the third insulating layer, and a fourth insulating layer covering a part of the first electrode.

2. The organic light-emitting display panel of claim 1, wherein:
the at least one touch key is configured to detect a touch interaction; and
detection of the touch interaction is based on a change in capacitance between the first electrode and the second electrode.

3. The organic light-emitting display panel of claim 1, wherein the touch key area further comprises an emission unit configured to emit light in response to the touch interaction.

4. The organic light-emitting display panel of claim 3, wherein the emission unit is disposed at least partially around the at least one touch key or disposed overlapping at least a portion of the at least one touch key.

5. The organic light-emitting display panel of claim 3, wherein the emission unit comprises:
a touch thin film transistor (TFT) configured to provide a touch data signal in response to reception of a touch scan signal; and
a touch organic light-emitting diode (OLED) configured to emit light based on reception of a current associated with the touch data signal.

6. The organic light-emitting display panel of claim 3, wherein the emission unit comprises:

a touch capacitor configured to store a voltage associated with a touch data signal;
a touch thin film transistor (TFT) configured to enable current flow in correspondence with the voltage being discharged from the touch capacitor; and
a touch organic light-emitting diode (OLED) configured to emit light in response to reception of the current flow.

7. The organic light-emitting display panel of claim 3, further comprising a driving integrated circuit (IC) configured to:
provide a driving signal to drive the pixels;
detect the touch interaction with the at least one touch key; and
provide a driving signal to drive the emission unit.

8. The organic light-emitting display panel of claim 1, wherein a portion of the second electrode of the OLED is not disposed above the at least one touch key.

9. An organic light-emitting display panel, comprising:
a substrate comprising a display area and a touch key area, the touch key area being disposed outside the display area;
pixels disposed in the display area; and
at least one touch key disposed in the touch key area,
wherein the at least one touch key comprises a first touch electrode and a second touch electrode spaced apart from the first touch electrode, the first touch electrode and the second touch electrode being disposed in the same layer as one another,
wherein each of the pixels comprises:
a thin film transistor (TFT) comprising a gate electrode on a first insulating layer and a source electrode and a drain electrode on a second insulating layer covering the gate electrode; and
an organic light-emitting diode (OLED) comprising a first electrode on a third insulating layer covering the source electrode and the drain electrode and electrically connected to one of the source electrode and the drain electrode, a second electrode, and an emitting layer between the first electrode and the second electrode, and
wherein both of the first touch electrode and the second touch electrode are disposed on one of the first insulating layer, the second insulating layer, the third insulating layer, and a fourth insulating layer covering a part of the first electrode.

10. The organic light-emitting display panel of claim 9, wherein:
the at least one touch key is configured to detect a touch interaction; and
detection of the touch interaction is based on a change in capacitance between the first electrode and the second electrode.

11. The organic light-emitting display panel of claim 10, wherein the touch key area further comprises an emission unit configured to emit light in response to the touch interaction.

12. The organic light-emitting display panel of claim 11, wherein the emission unit is disposed at least partially around the at least one touch key or disposed overlapping at least a portion of the at least one touch key.

13. The organic light-emitting display panel of claim 11, wherein the emission unit comprises:
a touch thin film transistor (TFT) configured to provide a touch data signal in response to reception of a touch scan signal; and
a touch organic light-emitting diode (OLED) configured to emit light based on reception of a current associated with the touch data signal.

14. The organic light-emitting display panel of claim 11, wherein the emission unit comprises:
a touch capacitor configured to store a voltage associated with a touch data signal;
a touch thin film transistor (TFT) configured to enable current flow in correspondence with the voltage being discharged from the touch capacitor; and
a touch organic light-emitting diode (OLED) configured to emit light in response to reception of the current flow.

15. The organic light-emitting display panel of claim 11, further comprising a driving integrated circuit (IC) configured to:
provide a driving signal to drive the pixels;
detect the touch interaction with the at least one touch key; and
provide a driving signal to drive the emission unit.

16. The organic light-emitting display panel of claim 9, wherein a portion of the second electrode of the OLED is not disposed above the at least one touch key.

* * * * *